(12) United States Patent
Chen et al.

(10) Patent No.: US 10,170,434 B2
(45) Date of Patent: Jan. 1, 2019

(54) WARPAGE CONTROL IN PACKAGE-ON-PACKAGE STRUCTURES

(71) Applicant: Taiwan Semiconductor Manufacturing Company, Ltd., Hsinchu (TW)

(72) Inventors: Wei-Yu Chen, Taipei (TW); Yu-Hsiang Hu, Hsinchu (TW); Wei-Hung Lin, Xinfeng Township (TW); Ming-Da Cheng, Jhubei (TW); Chung-Shi Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/948,247

(22) Filed: Apr. 9, 2018

(65) Prior Publication Data
US 2018/0226363 A1 Aug. 9, 2018

Related U.S. Application Data

(63) Continuation of application No. 15/370,653, filed on Dec. 6, 2016, now Pat. No. 9,941,221, which is a (Continued)

(51) Int. Cl.
*H01L 21/48* (2006.01)
*H01L 23/00* (2006.01)
(Continued)

(52) U.S. Cl.
CPC ........ *H01L 23/562* (2013.01); *H01L 21/4853* (2013.01); *H01L 21/4867* (2013.01); *H01L 21/565* (2013.01); *H01L 23/3114* (2013.01);
*H01L 23/3736* (2013.01); *H01L 23/49816* (2013.01); *H01L 23/49827* (2013.01);
(Continued)

(58) Field of Classification Search
CPC ............. H01L 21/4853; H01L 21/4867; H01L 21/565; H01L 23/562; H01L 23/3114; H01L 23/3736; H01L 23/49816; H01L 23/49827; H01L 23/49838; H01L 24/16; H01L 24/32; H01L 24/83; H01L 25/105; H01L 25/50
See application file for complete search history.

(56) References Cited

U.S. PATENT DOCUMENTS 5,089,881 A 2/1992 Panicker
5,672,548 A 9/1997 Culnane et al.
(Continued)

FOREIGN PATENT DOCUMENTS

JP 2007335740 A 12/2007

OTHER PUBLICATIONS

Green, Don, et al., "Perry's chemical engineers' handbook [electronic resource]," Nov. 13, 2008, 2 pages.

*Primary Examiner* — Sitaramarao S Yechuri
(74) *Attorney, Agent, or Firm* — Slater Matsil, LLP

(57) ABSTRACT

A package includes a bottom substrate and a bottom die over and bonded to the bottom substrate. A metal-particle-containing compound material is overlying a top surface of the bottom die, wherein the metal-particle-containing compound material comprises metal particles. A molding material molds at least a lower part of the bottom die therein, wherein the molding material is overlying the bottom substrate.

20 Claims, 8 Drawing Sheets

Related U.S. Application Data continuation of application No. 14/096,456, filed on Dec. 4, 2013, now Pat. No. 9,559,064.

(51) Int. Cl.
*H01L 21/56* (2006.01)
*H01L 23/31* (2006.01)
*H01L 23/373* (2006.01)
*H01L 23/498* (2006.01)
*H01L 25/10* (2006.01)
*H01L 25/00* (2006.01)

(52) U.S. Cl.
CPC ........ *H01L 23/49838* (2013.01); *H01L 24/16* (2013.01); *H01L 24/32* (2013.01); *H01L 24/83* (2013.01); *H01L 25/105* (2013.01); *H01L 25/50* (2013.01); *H01L 23/3128* (2013.01); *H01L 2224/0401* (2013.01); *H01L 2224/04042* (2013.01); *H01L 2224/16225* (2013.01); *H01L 2224/16227* (2013.01); *H01L 2224/29147* (2013.01); *H01L 2224/32225* (2013.01); *H01L 2224/32245* (2013.01); *H01L 2224/33517* (2013.01); *H01L 2224/33519* (2013.01); *H01L 2224/45099* (2013.01); *H01L 2224/48227* (2013.01); *H01L 2224/73265* (2013.01); *H01L 2224/83851* (2013.01); *H01L 2224/83855* (2013.01); *H01L 2225/1023* (2013.01); *H01L 2225/1058* (2013.01); *H01L 2225/1094* (2013.01); *H01L 2924/00014* (2013.01); *H01L 2924/12042* (2013.01); *H01L 2924/15311* (2013.01); *H01L 2924/15331* (2013.01); *H01L 2924/181* (2013.01); *H01L 2924/1815* (2013.01); *H01L 2924/3511* (2013.01)

(56) References Cited

U.S. PATENT DOCUMENTS

| | | | | |
|---|---|---|---|---|
| 5,789,810 A * | 8/1998 | Gross | ................ | H01L 21/4817 257/697 |
| 6,117,797 A * | 9/2000 | Hembree | ............ | H01L 21/4871 257/E23.125 |
| 6,359,235 B1 | 3/2002 | Hayashi | | |
| 7,098,073 B1 * | 8/2006 | Mangrum | ............. | H01L 23/552 257/686 |
| 7,372,151 B1 * | 5/2008 | Fan | ........................ | H01L 21/561 257/738 |
| 8,203,219 B2 | 6/2012 | Wyland | | |
| 8,299,595 B2 | 10/2012 | Yoon et al. | | |
| 8,815,648 B1 | 8/2014 | Aoya et al. | | |
| 9,559,064 B2 * | 1/2017 | Chen | ..................... | H01L 23/562 |
| 2001/0026010 A1 | 10/2001 | Horiuchi et al. | | |
| 2002/0017728 A1 | 2/2002 | Ramalingam et al. | | |
| 2003/0122226 A1 | 7/2003 | Cobbley et al. | | |
| 2005/0003585 A1 * | 1/2005 | Combs | ................ | H01L 21/4871 438/122 |
| 2005/0256241 A1 * | 11/2005 | Sachdev | ................... | C08K 3/08 524/439 |
| 2005/0258522 A1 | 11/2005 | En et al. | | |
| 2007/0296089 A1 * | 12/2007 | Thomas | ................. | C09J 163/00 257/783 |
| 2008/0073769 A1 | 3/2008 | Wu et al. | | |
| 2008/0258289 A1 * | 10/2008 | Pendse | .................... | H01L 21/56 257/690 |
| 2008/0303124 A1 | 12/2008 | Khan et al. | | |
| 2008/0315311 A1 | 12/2008 | Okamoto | | |
| 2009/0045527 A1 | 2/2009 | Tsai | | |
| 2009/0111221 A1 | 4/2009 | Tsai | | |
| 2010/0133675 A1 | 6/2010 | Yu et al. | | |
| 2010/0171205 A1 | 7/2010 | Chen et al. | | |
| 2010/0224974 A1 | 9/2010 | Shim et al. | | |
| 2010/0314739 A1 | 12/2010 | Kaufmann et al. | | |
| 2010/0327432 A1 * | 12/2010 | Sirinorakul | ......... | H01L 23/3107 257/712 |
| 2011/0012249 A1 * | 1/2011 | Daubenspeck | ....... | H01L 21/563 257/686 |
| 2011/0024887 A1 * | 2/2011 | Chi | ........................ | H01L 21/568 257/684 |
| 2011/0049689 A1 | 3/2011 | Iwasaki | | |
| 2011/0101394 A1 | 5/2011 | McKenzie et al. | | |
| 2011/0117700 A1 * | 5/2011 | Weng | ...................... | H01L 21/56 438/109 |
| 2011/0227209 A1 * | 9/2011 | Yoon | .................... | H01L 23/3128 257/686 |
| 2012/0001293 A1 | 1/2012 | Mohamed et al. | | |
| 2012/0119372 A1 | 5/2012 | Yasukawa | | |
| 2012/0319300 A1 * | 12/2012 | Kim | ...................... | H01L 25/105 257/777 |
| 2013/0087904 A1 | 4/2013 | Clark et al. | | |
| 2013/0113098 A1 | 5/2013 | Hwang et al. | | |
| 2013/0249106 A1 | 9/2013 | Lin et al. | | |
| 2013/0307163 A1 | 11/2013 | Inoue et al. | | |
| 2015/0028477 A1 * | 1/2015 | Jung | ......................... | H01L 24/13 257/738 |

\* cited by examiner

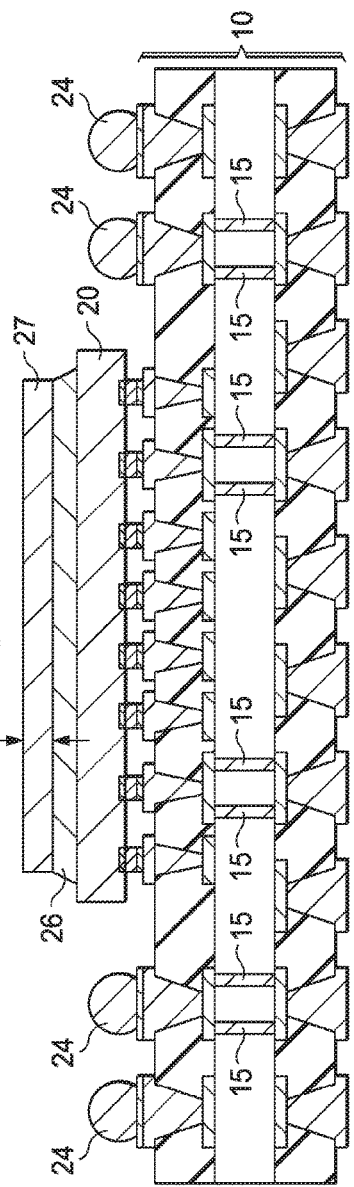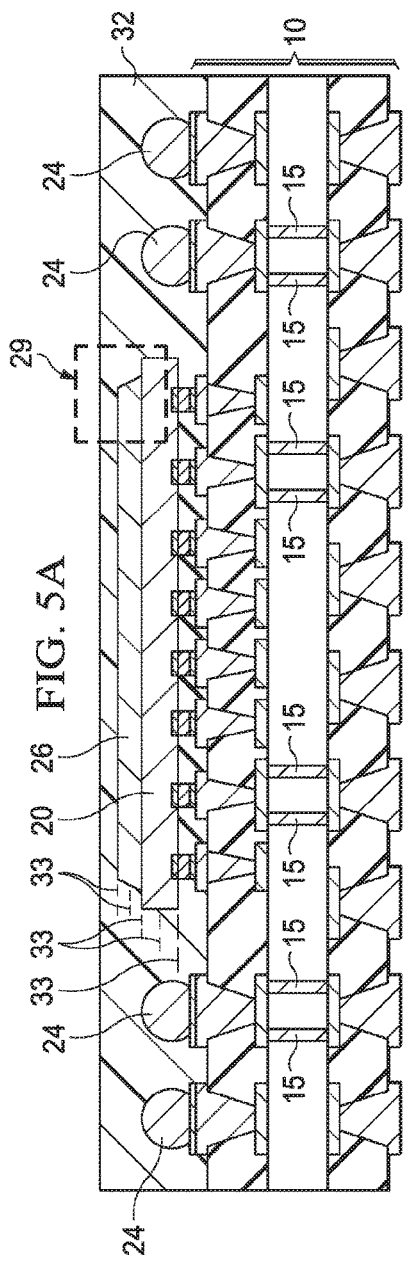

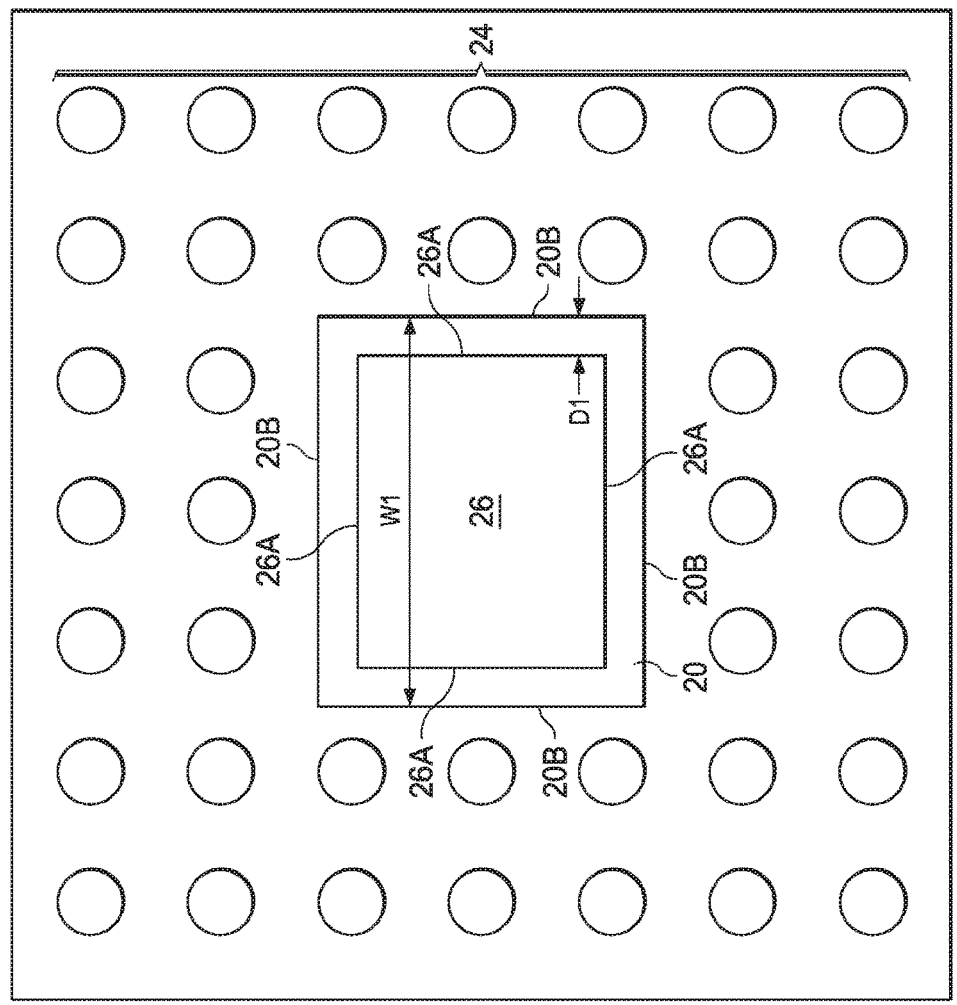

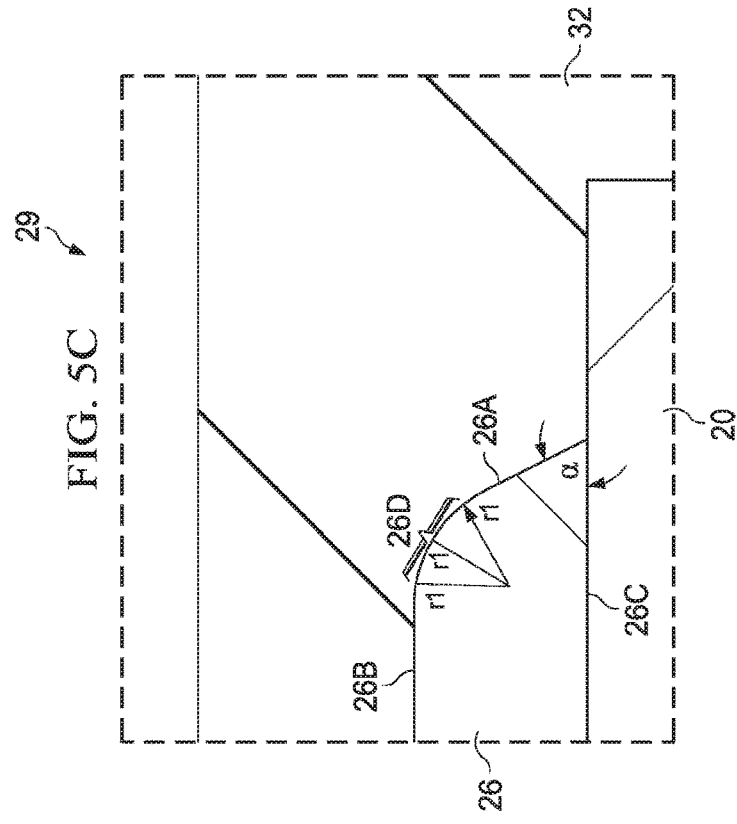
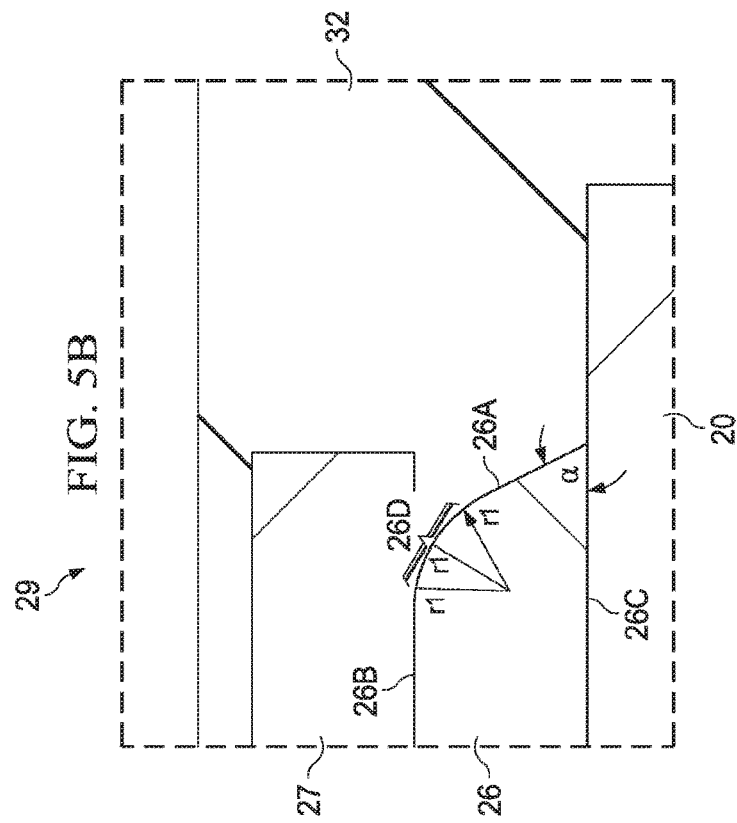

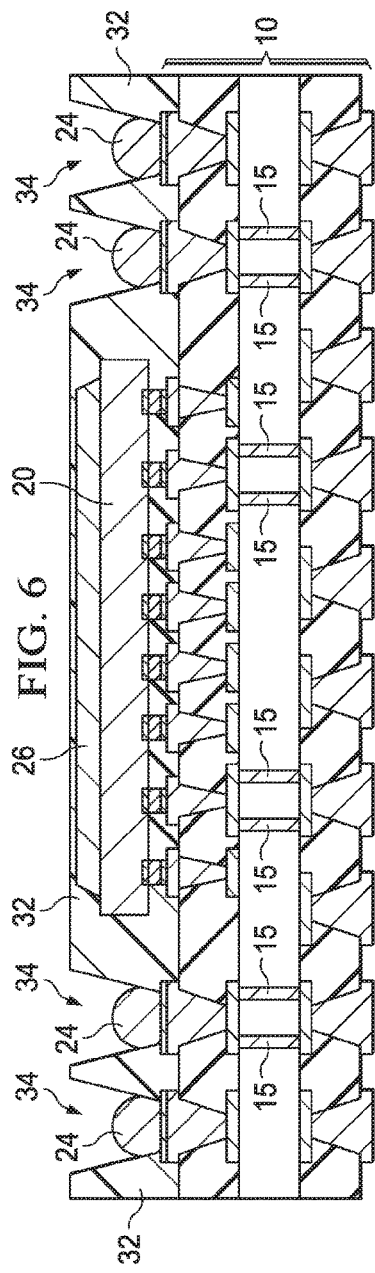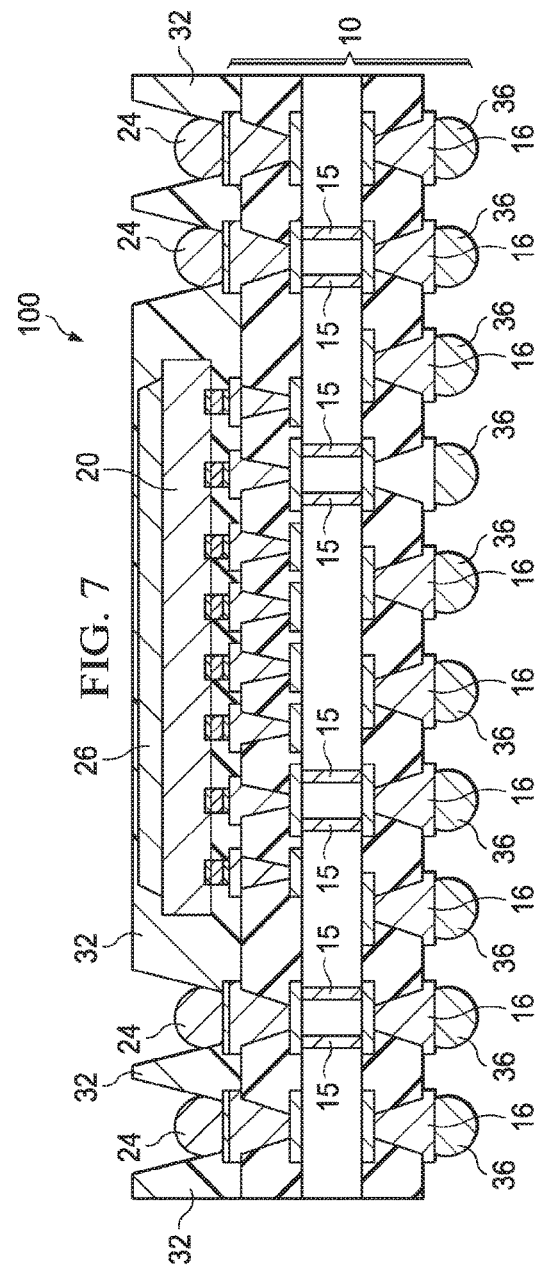

WARPAGE CONTROL IN PACKAGE-ON-PACKAGE STRUCTURES

PRIORITY CLAIM AND CROSS-REFERENCE

This application is a continuation of U.S. patent application Ser. No. 15/370,653, entitled "Warpage Control in Package-On-Package Structures," filed Dec. 6, 2016, which is a continuation of U.S. patent application Ser. No. 14/096,456, entitled "Warpage Control in Package-On-Package Structures," filed on Dec. 4, 2013, now U.S. Pat. No. 9,559,064 issued Jan. 31, 2017, which applications are incorporated herein by reference.

BACKGROUND

In a conventional Package-on-Package (PoP) process, a top package, in which a first device die is bonded, is further bonded to a bottom package through solder balls. The bottom package may also include a second device die bonded therein. The second device die may be on the same side of the bottom package as the solder balls.

Before the bonding of the top package to the bottom package, a molding compound is applied on the bottom package, with the molding compound covering the second device die and the solder balls. Since the solder balls are buried in the molding compound, a laser ablation or drilling is performed to form holes in the molding compound, so that the solder balls are exposed. The top package and the bottom package may then be bonded through the solder balls in the bottom package.

There is significant mismatch between the Coefficients of Thermal Expansion (CTEs) of the materials in the PoP packages. For example, the package substrate and the molding compound have CTEs that are much higher than that of the device dies. Accordingly, in the resulting package, there is a significant warpage.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 9 are cross-sectional views of intermediate stages in the manufacturing of a Package-on-Package (PoP) structure in accordance with some exemplary embodiments.

DETAILED DESCRIPTION

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package and the method of forming the same are provided in accordance with various embodiments. The intermediate stages of forming the packages are illustrated in accordance with some embodiments. The variations of the embodiments are discussed. Throughout the various views and illustrative embodiments, like reference numbers are used to designate like elements.

Figure 1:
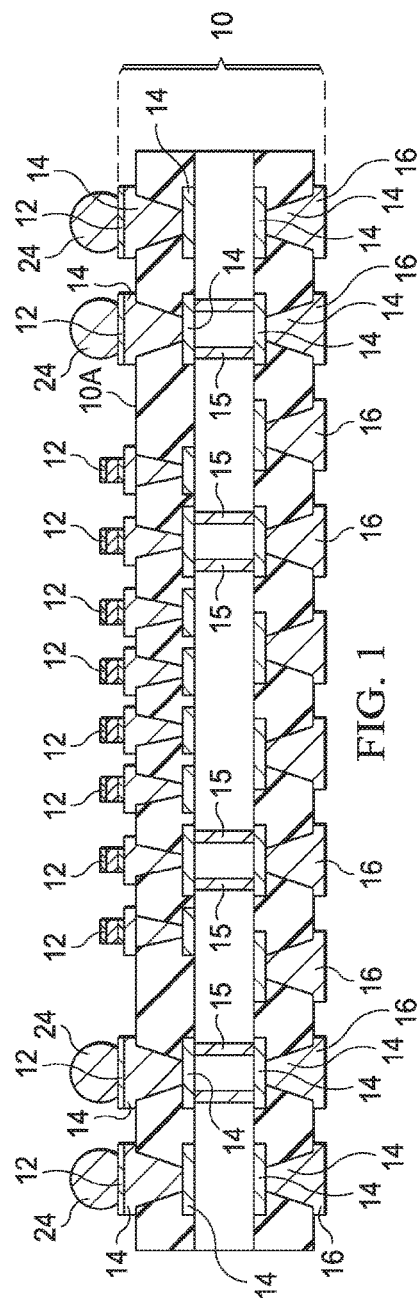

FIGS. 1 through 9 are cross-sectional views of intermediate stages in the manufacturing of a Package-on-Package (PoP) structure in accordance with some exemplary embodiment. Referring to FIG. 1, package component 10 is provided. In some embodiments, package component 10 is a package substrate, and hence in referred to as package substrate 10 hereinafter, although it may be of another type of package component such as an interposer or a package. Package substrate 10 may be a part of a package substrate strip (not shown). For example, a package substrate strip may include a plurality of package substrates having identical structures as package substrate 10. The package substrates in the package substrate strip may be arranged as an array.

Package substrate 10 may be a build-up substrate or a laminate substrate. For example, as a build-up substrate, package substrate 10 includes substrate 11 that is formed of a dielectric material, wherein conductive vias 15 penetrate through substrate 11. Package substrate 10 also includes metal lines/vias 14 on the opposite sides of substrate 11. Package substrate 10 may also be a laminate substrate, which includes laminated dielectric films, and conductive traces built in the dielectric films. Package substrate 10 is configured to electrically couple connectors 12 on the top side of package substrate 10 to conductive features 16 on the bottom side of package substrate 10. Conductive features 12 and 16 may be metal pads, for example.

Electrical connectors 24 are formed on top surfaces 10A of package substrate 10. Electrical connectors 24 are electrically coupled to, and may be in physical contact with, electrical connectors 12. In some embodiments, electrical connectors 24 are solder balls. In alternative embodiments, electrical connectors 24 comprise metal pads, metal pillars, solder caps formed on metal pillars, and/or the like. The solder regions (such as solder balls or the reflowed solder caps) of electrical connectors 24 may have round top surfaces, although the top surfaces of the solder regions may also be planar.

Figure 2:
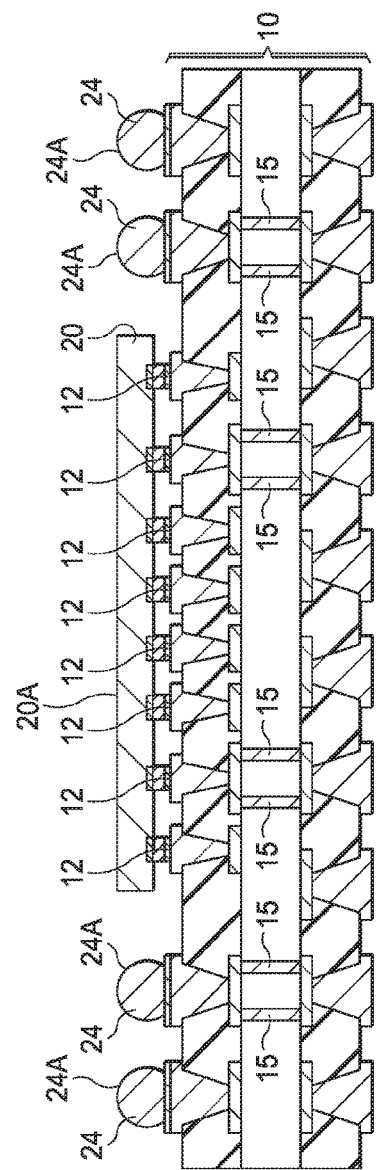

Referring to FIG. 2, device die 20 is bonded to package substrate 10 through electrical connectors 12. Throughout the description, device die 20 is also referred to as a bottom device die since it is located in a bottom package. Device die 20 may be circuit dies comprising integrated circuit devices (not shown) such as transistors, capacitors, inductors, resistors, and the like. Device die 20 may be a logic die such as a Central Computing Unit (CPU) die. Device die 20 may also represent a die stack include a plurality of dies stacked together. The bonding of device die 20 to electrical connectors 12 may be through solder bonding or direct metal-to-metal bonding (such as copper-to-copper bonding). In some embodiments, top ends 24A of electrical connectors 24 are substantially level with, or lower than, top surfaces 20A of device die 20. In alternative embodiments, top ends 24A of electrical connectors 24 are higher than top surface 20A of die 20.

Figure 3:
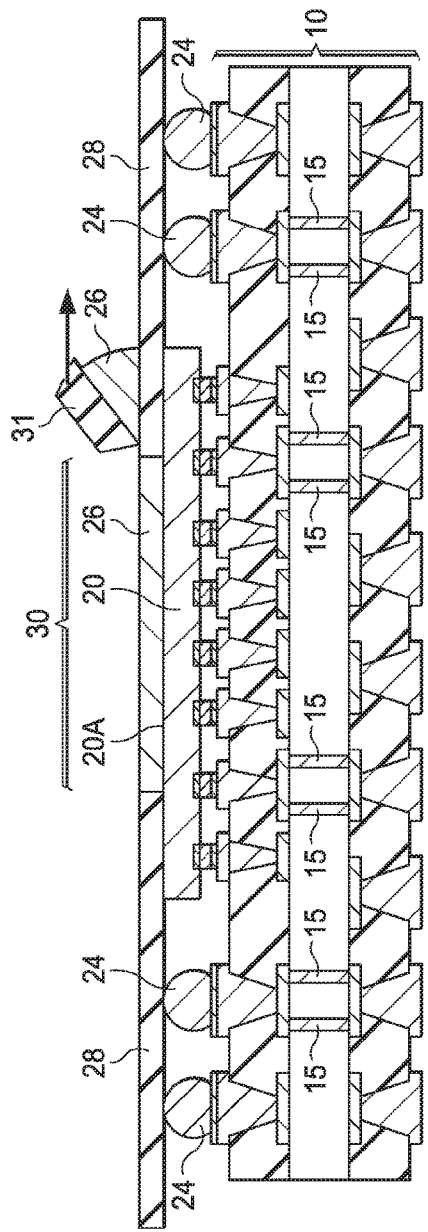

Referring to FIG. 3, metal-containing paste 26 is applied on top surface 20A of device die 20. In some embodiments, the application of metal-containing paste 26 is performed through stencil printing, which includes placing a stencil 28 over device die 20, with a through-hole 30 of stencil 28 being aligned to a center region of top surface 20A. Metal-containing paste 26 is then applied on stencil 28. Excess metal-containing paste 26 is then wiped out using squeegee 31. Squeegee 31 has a planar bottom surface, and hence the portion of metal-containing paste 26 left in through-hole 30 has a planar top surface. After stencil 28 is lifted, a portion of metal-containing paste 26 is left in hole 30.

Metal-containing paste 26 may include metal particles mixed with an adhesive. The metal particles may include the particles of a pure metal, a metal alloy, or the like. In some embodiments, metal-containing paste 26 is a copper paste including copper particles. The metal particles in metal-containing paste 26 may have a weight percentage greater than about 20 percent, wherein the weight percentage is measured either before or after the subsequent curing of metal-containing paste 26. The adhesive in metal-containing paste 26 may include Phenolic resin, epoxy resin, or the like. Metal-containing paste 26 may be electrically conductive, and hence may adopt the same paste that is used on electrical connector. In these embodiments, metal-containing paste 26 may be a solder paste. Metal-containing paste 26 is applied as a semi-fluid, so that it can be stencil-printed, yet can maintain its shape before cured. For example, metal-containing paste 26 has a viscosity in the range between about 800 Pa–S and about 1,300 Pa–S. In some embodiments, the diameters of the metal particles (the filler) in metal-containing paste 26 is between about 3 μm and about 10 μm, or between about 5 μm and about 6 μm. The glass transition temperature Tg of metal-containing paste 26 may be higher than about 100° C. In some exemplary embodiments, the glass transition temperature of metal-containing paste 26 is about 110° C.

Figure 4A:
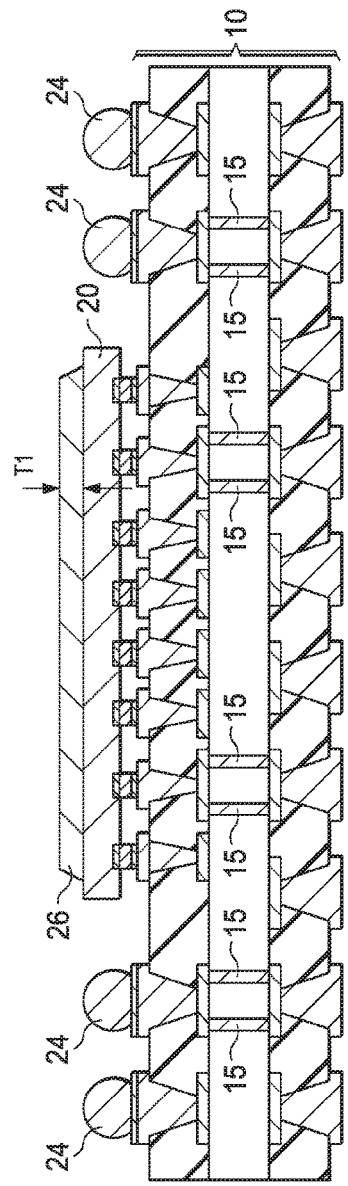

FIG. 4A illustrates the curing of metal-containing paste 26. Throughout the description, metal-containing paste 26 is alternatively referred to as a metal-particle-containing compound material. Stencil 28 as show in FIG. 3 is also removed. In some embodiments, metal-containing paste 26 includes thermal curing, for example, by heating metal-containing paste 26 to a temperature higher than the glass transition temperature of metal-containing paste 26. For example, the curing temperature may be between about 150° C. and about 200° C. The curing may be performed for a period of time between about 60 minutes and about 120 minutes, depending on the type of metal-containing paste 26. After the curing of metal-containing paste 26, the cured metal-containing paste 26 has a Coefficient of Thermal Expansion (CTE) greater than the CTE of device die 20. For example, device die 20 may include a silicon substrate, which has a CTE of about 3.2 ppm/° C. Hence, (the cured) metal-containing paste 26 has a CTE greater than 3.2 ppm/° C. Furthermore, the difference between the CTE of metal-containing paste 26 and the CTE of device die 20 may be greater than about 10 ppm/° C., greater than about 20 ppm/° C., or higher. The Young's modulus of metal-containing paste 26 is preferably high, for example, higher than about $5 \times 10^9$ Pa. Thickness T1 of metal-containing paste 26 may be greater than about 50 μm, so that it can provide enough support to balance the stresses in the resulting package.

The higher CTE (than device die 20) and the high Young's modulus of metal-containing paste 26 help balance the stresses in the resulting package. Package substrate 10 may have a high CTE, for example, higher than about 15 ppm/° C. Since device die 20 has a low CTE, the resulting package may have a warpage, wherein the center portion of the resulting package may by higher than the corner portions and edge portions. With metal-containing paste 26 and package substrate 10 (both having CTEs higher than that of device die 20) being disposed on the opposite sides of device die 20, the stresses in the resulting package (such as the stresses on the opposite sides of device die 20) are balanced, and the warpage in the resulting package is reduced.

As shown in FIG. 4A, due to the weight of metal-containing paste 26 and its viscosity, the shape of metal-containing paste 26 may change slightly before and during the curing process. The resulting cured metal-containing paste 26 may have a profile with the bottom portions larger than the upper portions. The edges of metal-containing paste 26 are also tilted. Hence, metal-containing paste 26 may have a trapezoid shape in the cross-sectional view. Furthermore, the top corners of metal-containing paste 26 may be rounded.

FIG. 4B illustrates the package in accordance with alternative embodiments. In these embodiments, rigid plate 27 is placed over metal-containing paste 26. Rigid plate 27 may be pre-formed before the placement, and may have a CTE greater than the CTE of device die 20. The Young's modulus of rigid plate 27 is preferably high, for example, higher than about $5 \times 10^9$ Pa. The Young's modulus of right plate 27 may also be higher than the Young's moduli of metal-containing paste 26, silicon, and the subsequently applied molding compound 32 (FIG. 5A). Rigid plate 27 may have thickness T2 greater than about 30 μm in some embodiments. In some embodiments, rigid plate 27 includes a copper plate. In alternative embodiments, rigid plate 27 may be another type of metal plate including, and not limited to, a stainless steel plate, a Al plate, a Cu plate, or the like. In yet alternative embodiments, rigid plate 27 comprises a non-metal plate, which may include ceramic, for example. In the embodiments that rigid plate 27 is included, metal-containing paste 26 may act as the adhesive for adhering rigid plate 27 onto device die 20.

The formation of the package in FIG. 4B may include applying metal-containing paste 26 on the top surface of device die 20, and placing rigid plate 27 over metal-containing paste 26. After rigid plate 27 is placed over metal-containing paste 26, a curing process is performed to cure metal-containing paste 26. Metal-containing paste 26 thus acts as the adhesive for adhering rigid plate 27 to the underlying device die 20.

FIG. 4C illustrates a top view of package substrate 10, device die 20, and solder balls 24, wherein the top view may be the top view of FIG. 4A or FIG. 4B. In some embodiments, solder balls 24 are disposed surrounding device die 20. Metal-containing paste 26 covers a center portion of device die 20. The edges 26A of metal-containing paste 26 are spaced apart from edges 20B of device die 20 by margin D1, so that the applied metal-containing paste 26 does not flow over the edges of device die 20. In some embodiment, margin D1 is between about 300 μm and about 1,000 μm. When the width of device die 20 is denoted as W1, ratio D1/W1 may also be between about 0.02 and about 0.08 in some embodiments, although different ratios may be used.

Referring to FIG. 5A, molding material 32 is molded on dies 20 and package substrates 10, and is then cured. Molding material 32 may be different from the adhesive in metal-containing paste. In some exemplary embodiments, molding material 32 comprises a polymer, which may be a molding compound, an underfill, a Molding Underfill (MUF), or the like. Solder balls 24 are buried in molding material 32 in some embodiments. In alternative embodiments, the lower portions of solder balls 24 are in molding material 32, and the upper portions of molding material 32 protrude above molding material 32.

In some embodiments, molding material 32 molds metal-containing paste 26 and rigid plate 27 (if any, FIG. 4B) therein. In alternative embodiments, molding material 32 molds a lower part of device die 20, and the top surface of molding material 32 may be at any level that is underlying the top surface of metal-containing paste 26 (or rigid plate 27 when it exists). For example, the top surface of molding material 32 may be at the levels shown as 33, which are marked by dashed lines. In some embodiments, the top surface of molding material 32 is level with the top surface of rigid plate 27. In alternative embodiments, the top surface of molding material 32 is between the top surface and the bottom surface of rigid plate 27. In yet alternative embodiments, the top surface of molding material 32 is level with the interface of rigid plate 27 and metal-containing paste 26. In yet alternative embodiments, the top surface of molding material 32 is between the top surface and the bottom surface of metal-containing paste 26. The top surface of molding material 32 may also be level with or lower than the bottom surface of metal-containing paste 26.

FIGS. 5B and 5C illustrate the magnified views of portion 29 of the package in FIG. 5A. As shown in FIGS. 5B and 5C, metal-containing paste 26 includes top surface 26B, edge 26A, and bottom surface 26C that is in contact with the top surface of device die 20. Top surface 26B includes a portion that is substantially planar. Edge 26A may also include a substantially straight portion forming a rounded corner 26D with the planar portion of top surface 26B. The radius r1 of the rounded corner 26D may be in the range between about 20 µm and about 40 µm in some exemplary embodiments. The substantially straight edge 26A of metal-containing paste 26 and bottom surface 26C form angle α, which may be between about 45 degrees and about 75.

In some embodiments, as shown in FIG. 5B, rigid plate 27 is used, and hence the planar top surface 26B is in contact with the bottom surface of rigid plate 27. In alternative embodiments, as shown in FIG. 5C, rigid plate 27 is not used, and hence edge 26A is in contact with molding material 32. Depending on where the top surface of molding material 32 is located, edge 26A and the rounded corner 26D may, or may not, in contact with molding material 32B in various embodiments.

FIG. 6 illustrates the exposure of solder balls 24. In some embodiments, the exposure includes a laser trimming step to remove the portions of molding material 32 that covers solder balls 24. The energy of the laser used in the laser trimming process is adjusted, so that molding material 32 is trimmed when exposed to the laser, while solder balls 24 are not removed even exposed to the laser. As shown in FIG. 6, as a result of the laser trimming, openings 34 are formed, with solder balls 24 exposed to openings 34.

FIG. 7 illustrates the formation of solder balls 36 on metal pads 16. Throughout the description, the structure shown in FIG. 7, which includes package substrate 10, device die 20, molding material 32, and metal-containing paste 26 etc. are in combination referred to as bottom package 100.

Figure 8:
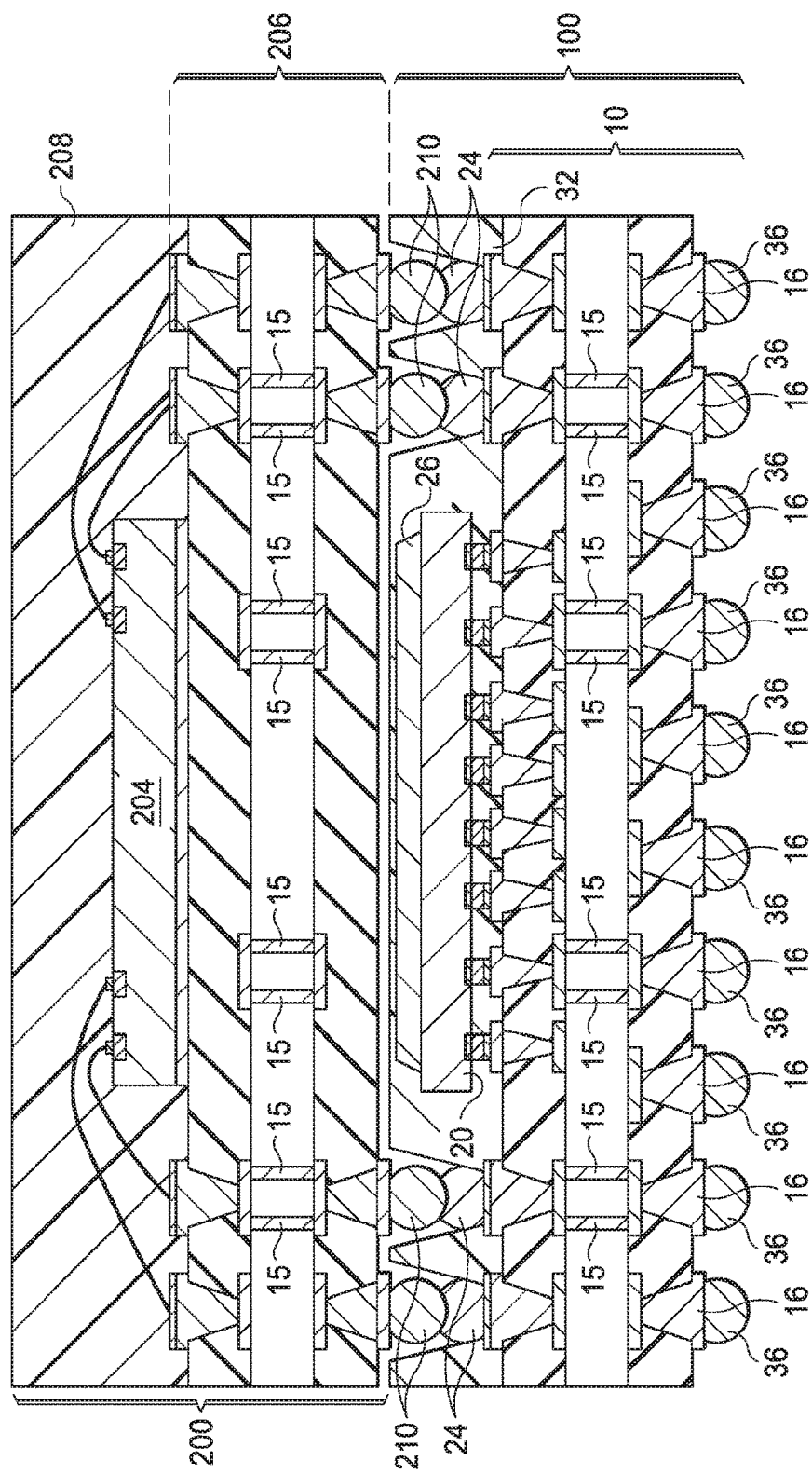

Referring to FIG. 8, top package 200 is placed onto bottom packages 100. Solder balls 210 of top package 200 are aligned to, and are placed on, solder balls 24. In some embodiments, top package 200 includes device die 204, and package substrate 206, on which device die 204 is bonded. Furthermore, molding material 208 may be molded on device die 204 to form top package 200.

Figure 9:
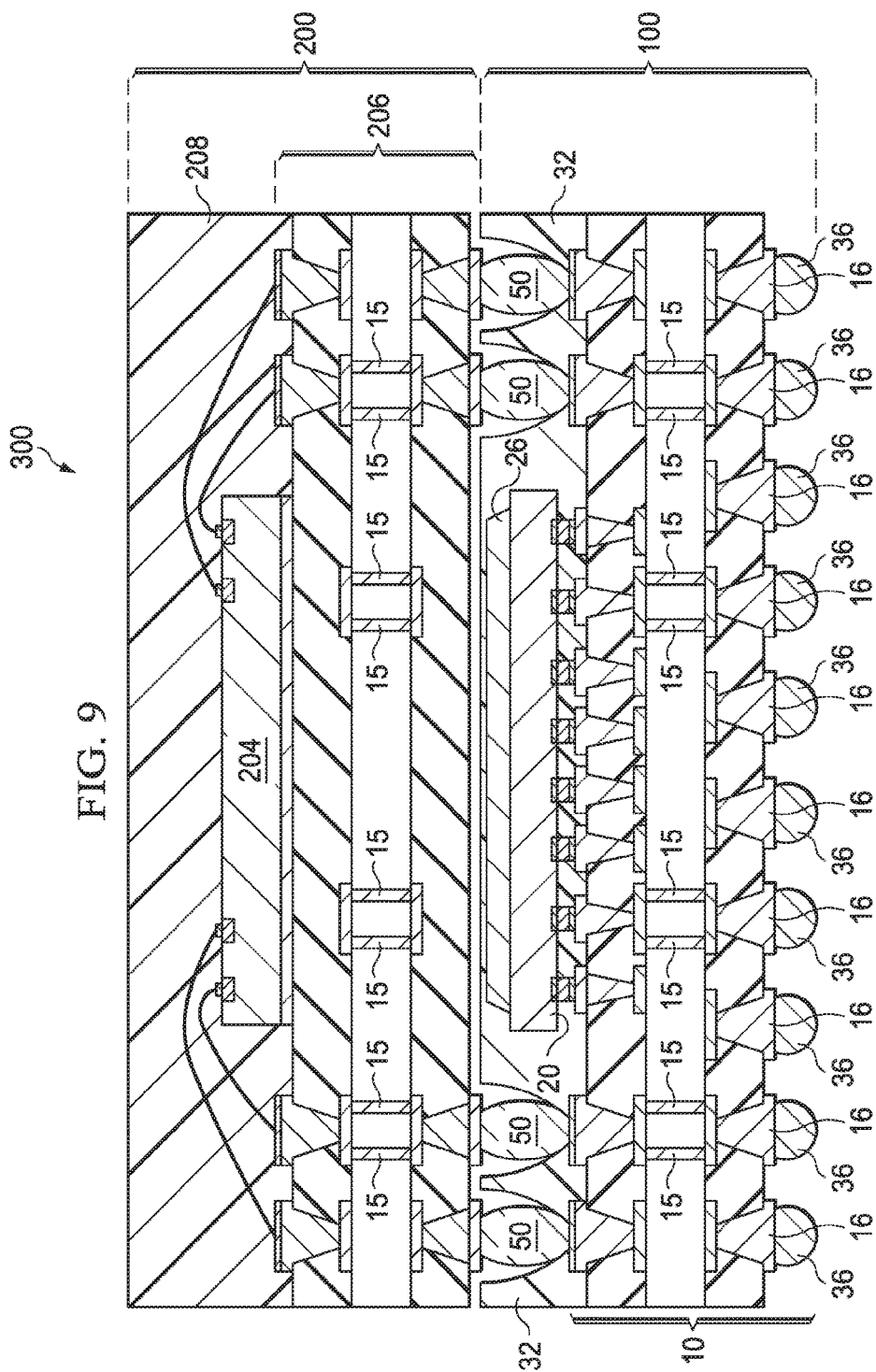

Next, as shown in FIG. 9, a reflow is performed, and hence top package 200 is bonded to bottom package 100. After the reflow, solder balls 24 and 210 (FIG. 8) are molten and joined, and the resulting solder regions are referred to as solder regions 50 in FIG. 8. After the reflow, a underfill (not shown) may be disposed between top packages 200 and bottom package 100. A sawing step may be performed to saw top package 200 and bottom package 100 apart from other parts (for example, the respective package substrate strip). The resulting package is referred to as a PoP package 300.

In the embodiments of the present disclosure, by applying a metal-containing paste that has a CTE greater than the CTE of the respective underlying device die, the difference in the CTEs of the materials on the opposite sides of the device die reduced, and stresses in the resulting PoP package is reduced. The warpage is the resulting PoP package is also reduced.

In accordance with some embodiments, a package includes a bottom substrate and a bottom die over and bonded to the bottom substrate. A metal-particle-containing compound material is overlying a top surface of the bottom die, wherein the metal-particle-containing compound material comprises metal particles. A molding material molds at least a lower part of the bottom die therein, wherein the molding material is overlying the bottom substrate.

In accordance with other embodiments, a package includes a top package bonded to a bottom package. The bottom package includes a package substrate, and a device die over and bonded to the package substrate. A metal-particle-containing compound material is overlying a top surface of the device die, wherein the metal-particle-containing compound material comprises metal particles. A molding compound is overlying the package substrate, wherein the molding compound molds the device die therein. The top package is bonded to the bottom package through solder regions penetrating through the molding compound.

In accordance with yet other embodiments, a method includes bonding a device die over a package substrate, applying a metal-containing paste over a top surface of the device die, and curing the metal-containing paste. After curing the metal-containing paste, the device die is molded in a molding compound, wherein the molding compound includes a portion overlying the package substrate.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
    a bottom package comprising:
        a package component; and
        a device die over and bonded to the package component;
    an adhesive layer over a top surface of the device die, wherein the adhesive layer comprises a slanted sidewall, a planar top surface, and a curved corner joining the slanted sidewall to the planar top surface;
    a rigid plate over and contacting the planar top surface of the adhesive layer;
    a molding compound, wherein at least a lower portion of the device die is in the molding compound; and a top package bonded to the bottom package through solder regions penetrating through the molding compound.

2. The package of claim 1, wherein the molding compound has a top surface lower than a top surface of the device die.

3. The package of claim 2, wherein an entirety of the molding compound is lower than the top surface of the device die.

4. The package of claim 1, wherein the molding compound comprises a portion covering the rigid plate.

5. The package of claim 1, wherein the adhesive layer comprises metal particles mixed therein.

6. The package of claim 1, wherein the rigid plate comprises a non-metal plate.

7. The package of claim 6, wherein the rigid plate comprises ceramic.

8. The package of claim 1, wherein the rigid plate is spaced apart from a bottom surface of the top package by a space.

9. The package of claim 1, wherein a joining point of the curved corner joining the rigid plate is directly underlying the rigid plate, and is laterally spaced apart from side edges of the rigid plate.

10. The package of claim 1, wherein the molding compound contacts the curved corner.

11. The package of claim 1, wherein the slanted sidewall of the adhesive layer has a first portion overlapped by the rigid plate, and a second portion extending laterally beyond edges of the rigid plate.

12. A package comprising:
a bottom package comprising:
 a package component; and
 a device die over and bonded to the package component;
a metal-particle-containing compound material over a top surface of the device die, wherein the metal-particle-containing compound material comprises an adhesive and metal particles mixed in the adhesive;
a rigid plate over and contacting the metal-particle-containing compound material;
an encapsulant over the package component and encapsulating a portion of the device die therein;
a top package bonded to the bottom package through solder regions, wherein the solder regions penetrate through the encapsulant; and
an underfill between the bottom package and the top package.

13. The package of claim 12, wherein a portion of the encapsulant overlies and contacts a top surface of the rigid plate.

14. The package of claim 12, wherein the rigid plate is formed of a non-metal material.

15. The package of claim 12, wherein the rigid plate is a ceramic plate.

16. The package of claim 12, wherein a top surface of the underfill is in contact with the rigid plate.

17. A package comprising:
a device die;
a metal-particle-containing compound material over a top surface of the device die, wherein the metal-particle-containing compound material comprises an adhesive and metal particles mixed in the adhesive, wherein the metal-particle-containing compound material has a top-view area smaller than a top-view area of the device die, and wherein lower portions of the metal-particle-containing compound material have top-view areas greater than top-view areas of upper portions of the metal-particle-containing compound material;
a metal plate over and contacting the metal-particle-containing compound material;
a molding compound molding a lower portion of the device die therein;
solder regions penetrating through the molding compound; and
a top package bonded to the solder regions, wherein the molding compound is spaced apart from a bottom surface of the top package.

18. The package of claim 17, wherein the metal-particle-containing compound material and the metal plate are higher than the molding compound.

19. The package of claim 18, wherein an entirety of the molding compound is lower than the metal-particle-containing compound material and the metal plate.

20. The package of claim 17, wherein the metal plate is spaced apart from a bottom surface of the top package by a space.

* * * * *